United States Patent
Sjöland et al.

(10) Patent No.: US 8,060,048 B2
(45) Date of Patent: Nov. 15, 2011

(54) MIXER ARRANGEMENT

(75) Inventors: Henrik Sjöland, Löddeköpinge (SE); Fredrik Tillman, Lund (SE)

(73) Assignee: Telefonaktibolaget L M Ericsson (Publ), Stockholm (SE)

( * ) Notice: Subject to any disclaimer, the term of this patent is extended or adjusted under 35 U.S.C. 154(b) by 1286 days.

(21) Appl. No.: 10/596,691

(22) PCT Filed: Nov. 17, 2004

(86) PCT No.: PCT/EP2004/013000
§ 371 (c)(1), (2), (4) Date: Mar. 8, 2007

(87) PCT Pub. No.: WO2005/060089
PCT Pub. Date: Jun. 30, 2005

(65) Prior Publication Data
US 2007/0230558 A1 Oct. 4, 2007

Related U.S. Application Data

(60) Provisional application No. 60/529,984, filed on Dec. 16, 2003.

(30) Foreign Application Priority Data

Dec. 10, 2003 (EP) .................................... 03028350

(51) Int. Cl.
*H04B 1/26* (2006.01)
*H04B 15/00* (2006.01)
*H04B 1/28* (2006.01)

(52) U.S. Cl. ......... 455/313; 455/323; 455/326; 455/333
(58) Field of Classification Search .......... 455/313–326, 455/333; 327/355, 359
See application file for complete search history.

(56) References Cited

U.S. PATENT DOCUMENTS

| | | | | |
|---|---|---|---|---|
| 5,999,804 | A * | 12/1999 | Forgues | 455/333 |
| 6,121,818 | A | 9/2000 | Kim et al. | |
| 6,144,845 | A * | 11/2000 | Durec | 455/285 |
| 6,226,509 | B1 * | 5/2001 | Mole et al. | 455/302 |
| 6,370,372 | B1 * | 4/2002 | Molnar et al. | 455/323 |
| 6,512,408 | B2 * | 1/2003 | Lee et al. | 327/359 |
| 6,639,447 | B2 * | 10/2003 | Manku et al. | 327/359 |
| 6,810,242 | B2 * | 10/2004 | Molnar et al. | 455/326 |
| 7,248,850 | B2 * | 7/2007 | Shen | 455/318 |
| 2001/0046849 | A1 | 11/2001 | Villemazet et al. | |
| 2002/0051497 | A1 | 5/2002 | Breems et al. | |

FOREIGN PATENT DOCUMENTS
FR 2 762 942 A 11/1998

* cited by examiner

*Primary Examiner* — Simon Nguyen

(57) ABSTRACT

A quadrature connected passive mixer arrangement for frequency converting analog signals from a first to a second frequency. The arrangement comprises two parallel connected mixers provided as transistors. First and second LO signals and their inverse signals having separated phases are provided for driving the transistors. Signal path switches are provided between the RF terminals and the mixer transistors. The switches are driven by signals having a different phase than the signal driving the corresponding mixer transistor. Thus, any short circuit between IF terminals of the arrangement may be eliminated.

29 Claims, 3 Drawing Sheets

MIXER ARRANGEMENT

This application claims the benefit of U.S. Provisional Application No. 60/529984, filed Dec. 16, 2003, the disclosure of which is fully incorporated herein by reference.

TECHNICAL FIELD OF THE IVNENTION

The present invention relates to an arrangement for mixing analog signals, and more particularly to a mixer arrangement for converting a first signal having a first frequency to a second signal having a second frequency.

DESCRIPTION OF RELATED ART

A mixer for frequency translating a signal having a first frequency, such as a radio frequency (RF), to a signal having a second frequency, such as an intermediate frequency (IF), is provided in a wide variety of implementations, such as in radio transceiver front-ends. Bluetooth® is a communication standard where the major goal has been to remove cable connections between electrical equipment. One area, where Bluetooth® is of particular interest, is communication involving portable equipment, such as mobile terminals. The terminals may also be adapted to communicate according to e.g. a telecommunication technology, such as GSM, UMTS, cdma2000, PCS, DCS etc. A mixer may be necessary for the radio transceiver front-end of the Bluetooth® radio and the telecommunication radio.

In portable communication equipment, low power solutions for all electronic components are important. Thus, the tendency in integrated circuit design is to apply low supply voltage for e.g. the mixer. Also, it is often required that the implementation of the mixer is cheap. MOS (Metal Oxide Semiconductor) technology offers a solution, with which is possible to implement fully integrated mixers. However, it is essential to find circuit architectures capable of high performance at supply voltages at or below 2V.

In modern radio communication architectures, such as direct-conversion and low-IF, quadrature mixers are needed. A suitable mixer topology at low voltage and low (or zero) IF frequency is the passive quadrature mixer, which is well suited for implementation in CMOS technology. This topology is suitable for low voltage due to the lack of stacked transistors, and for low IF frequencies due to the absence of flicker noise.

FIG. 1 illustrates a passive mixer, which is known in the art. Two passive mixers comprising four CMOS transistors each are connected in parallel and operated in quadrature. Thus, each transistor will be active when a local oscillator (LO) signal at its gate has a positive value. Each mixer is connected to provide signal paths from RF terminals to first and second IF terminals through transistors controlled by a common LO signal. At the IF terminals first and second IF signals $IF_I$, $IF_Q$ are provided. The first mixer is operated by a first LO signal $LO_I^+$ and its inverse signal $LO_I^-$ having a first phases $\square$ and $\square+\pi$ radians, respectively. The second mixer is driven by a second LO signal $LO_Q^+$ and its inverse signal $LO_Q^-$ having a second phase $\square+\pi/2$ and $\square+3\pi/2$ radians, respectively. In operation, two LO signals will have positive values simultaneously. Although the transistors are operated such that the IF terminals are generating the IF signals alternately, a path (short circuit) is created between the IF terminals of the two mixers when any two $LO_I$ and $LO_Q$ signals are high. This is e.g. the case when $LO_I^+$ and $LO_Q^+$ have positive values simultaneously. This is a problem as the undesired paths between the IF terminals will ruin the gain of the mixers.

In the known art, the problem with the undesired short circuits has been solved by providing resistors between the RF terminals and each of the mixers, wherein the impedance in the paths between the IF terminals increases. However, this introduces another problem as it will also introduce additional noise. This is particularly severe for low voltage circuits. FR 2 762 942 discloses a passive mixer with a differential input and a differential output. The passive mixer comprises field-effect transistors.

SUMMARY OF THE INVENTION

It is an object of the present invention to provide a quadrature mixer arrangement comprising two mixers for converting a signal having a first frequency to a signal having a second frequency. More specifically, it is an object of the invention to provide a mixer arrangement comprising two quadrature mixers, which are isolated from each other without substantially effecting the noise performance of the arrangement. Moreover, it is an object of the invention to provide a mixer arrangement that is suitable for implementation using MOS technology.

According to a first aspect of the invention, the above objects are achieved by a quadrature mixer arrangement for converting a first signal at a first frequency to a second signal at a second frequency.

The arrangement comprises a first mixer operatively coupled to a first and a second terminal. The first terminal is a positive radio-frequency (RF) terminal and the second terminal is a negative RF terminal. The arrangement further comprises a second mixer coupled in parallel with the first mixer and operatively coupled to the first, and second terminals. The first mixer is arranged to be conductive for a first and/or a second state of a first mixing signal, and arranged to mix the first signal with the first mixing signal to provide the second signal. The second mixer is arranged to be conductive for a first and/or a second state of a second mixing signal, and arranged to mix the first signal with the second mixing signal to provide the second signal. A set of switch devices is provided in the signal path(s) between the mixers and the first and second terminals. Switch devices coupled to the first mixer are arranged to be conductive for the first and/or second state of the second mixing signal. Switch devices coupled to the second mixer are arranged to be conductive for the first and/or the second state of the first mixing signal.

The first and second mixing signals and their respective inverse signals are provided by four local oscillator (LO) signals, which are phase shifted pi/2 radians in relation to each other.

The first and second mixers may comprise a set of mixing means, each having a first, second, and third terminal. The first mixer is adapted to be driven by a first LO signal and its inverse signal having a first and a third phase, respectively, received at the third terminals of the mixing means of the first mixer. The second mixer is adapted to be driven by a second LO signal and its inverse signal having a second and a fourth phase, respectively, received at the third terminals of the mixing means of the second mixer.

In each mixer, first and second switch devices may be provided in the signal path between the first terminals of the first and the third mixing means and the first RF terminal. Similarly, third and forth switch devices may be provided between the second terminals of the second and fourth mixing means and the second RF terminal. Thus any short circuit between the IF terminals may be avoided.

The mixers and/or the switch devices may comprise FET transistors provided in CMOS technology.

The mixer arrangement may be provided either as a transmitter or receiver mixer. In a transmitter mixer, a quadrature IF signal will be provided as input signal and an RF signal as output signal. In a receiver mixer, an RF signal will be provided as input signal, and a quadrature IF signal will be provided as output signal.

According to a second aspect of the invention, a wireless communication device having a communication interface for wirelessly communicating with a remote communication device, comprising the mixer arrangement according to the invention achieves the objects of the invention.

The device may be a portable radio communication equipment, a mobile radio terminal, a mobile telephone, a pager, a communicator, an electronic organizer, or a smartphone.

According to a third aspect of the invention, a method of mixing signals for converting a first signal at a first frequency to a second signal at a second frequency achieves the objects of the invention.

The method comprises the step of receiving the first signal. The method further comprises the step of mixing the first signal in a mixer arrangement comprising a first and a second mixer coupled in parallel to provide the second signal. Each mixer is coupled to a first and a second terminal. The first terminal is a positive RF terminal and the second terminal is a negative RF terminal. The first mixer is controlled to be conductive for a first and/or a second state of a first mixing signal for mixing the first signal with the first mixing signal to provide the second signal. The second mixer is controlled to be conductive for a first and/or a second state of a second mixing signal for mixing the first signal with the second mixing signal to provide the second signal. The method further comprises the step of controlling a set of switch devices provided in a signal path between the mixers and the first and second terminals to operatively couple either the first or the second mixer to the first and second terminals. Switch devices coupled to the first mixer are controlled to be conductive for the first and/or the second state of the second mixing signal. Switch devices coupled to the second mixer are controlled to be conductive for the first and/or the second state of the first mixing signal.

Further embodiments of the invention are defined in the dependent claims.

It is an advantage of the invention that the IF short circuit paths between the parallel coupled mixers of the invention are eliminated. Furthermore, it is an advantage that the noise performance compared with the known art is substantially improved such that the mixer arrangement is well suited for implementation in MOS technology and may be adapted for low supply voltage and low (or zero) IF frequency.

It should be emphasized that the term" comprises/comprising" when used in this specification is taken to specify the presence of stated features, integers, steps or components but does not preclude the presence or addition of one or more other features, integers, steps, components or groups thereof.

BRIEF DESCRIPTION OF THE DRAWINGS

Further objects, features, and advantages of the invention will appear from the following description of several embodiments of the invention, wherein various aspects of the invention will be described in more detail with reference to the accompanying drawings, in which.

DETAILED DESCRIPTION OF EMBODIMENTS

Figure 2:
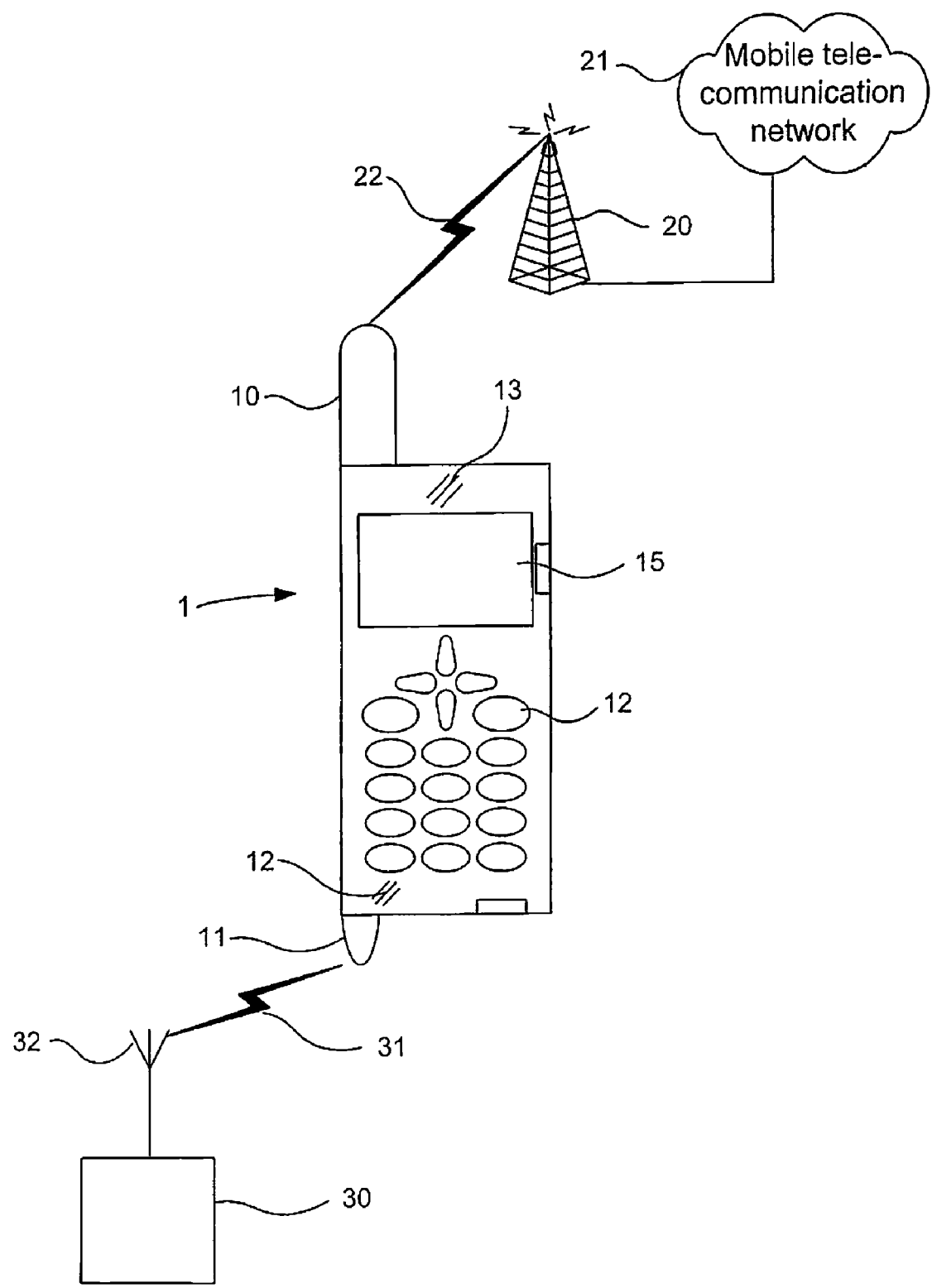
FIG. 2 is a front view of a mobile telephone and the environment in which it may operate.

FIG. 2 illustrates a mobile telephone 1 as one exemplifying electronic equipment, in which the mixer according to the present invention may be provided, and a possible environment in which it may operate. The invention is not limited to a mobile telephone 1. The invention may be provided in a wide variety of electronic equipment wherein a mixer is required for converting a first input signal having a first frequency to a second signal having a second frequency. The mobile telephone 1 may comprise a first antenna 10 and a second auxiliary antenna 11. A microphone 12, a loudspeaker 13, a keypad 14, and a display 15 provide a man-machine interface for operating the mobile telephone 1.

The mobile telephone may in operation be connected to a radio station 20 (base station) of a mobile communication network 21, such as a GSM, UMTS, PCS, and/or DCS network, via a first radio link 22 by means of the first antenna 10. Furthermore, the mobile telephone 1 may in operation establish a second wireless link to a peripheral device 30 via a second wireless link 31 by means of the auxiliary antenna 11. The second link 31 is e.g. a Bluetooth® link, which is established in the 2.4 (2.400-2.4835) GHz frequency range. To establish the wireless links 22, 31, the mobile telephone 1 comprises radio resources, which are adapted according to the relevant technologies that are used. Thus, the mobile telephone 1 comprises a first radio access means, such as a transceiver, for communicating with the base station 20, and a second radio access means for communicating with the peripheral device 30.

The peripheral device 30 may be any device having wireless communicating capabilities, such as according to Bluetooth® technology or any other wireless local area network (WLAN) technology. It comprises an antenna 32 for exchanging signals over the second link 31, and a transceiver (not shown) adapted according to the communication technology that the peripheral device 30 uses. The device may be a wireless headset, a remote server, a fax machine, a vending machine, a printer etc. A wide variety of electronic equipment may have such communication capabilities and have a need for wirelessly transferring of data.

When receiving signals having radio frequencies (RF), the RF signals may have to be down converted to a signal having a lower frequency, such as an intermediate frequency (IF) before further signal processing is applied. Similarly, an IF signal may have to be up converted to a signal having a higher frequency, such as a RF frequency, before transmitted. Thus, the radio access means of the mobile telephone 1 may comprise one or several mixers according to the invention for converting a signal having a first frequency to a signal having a second frequency.

Figure 3:
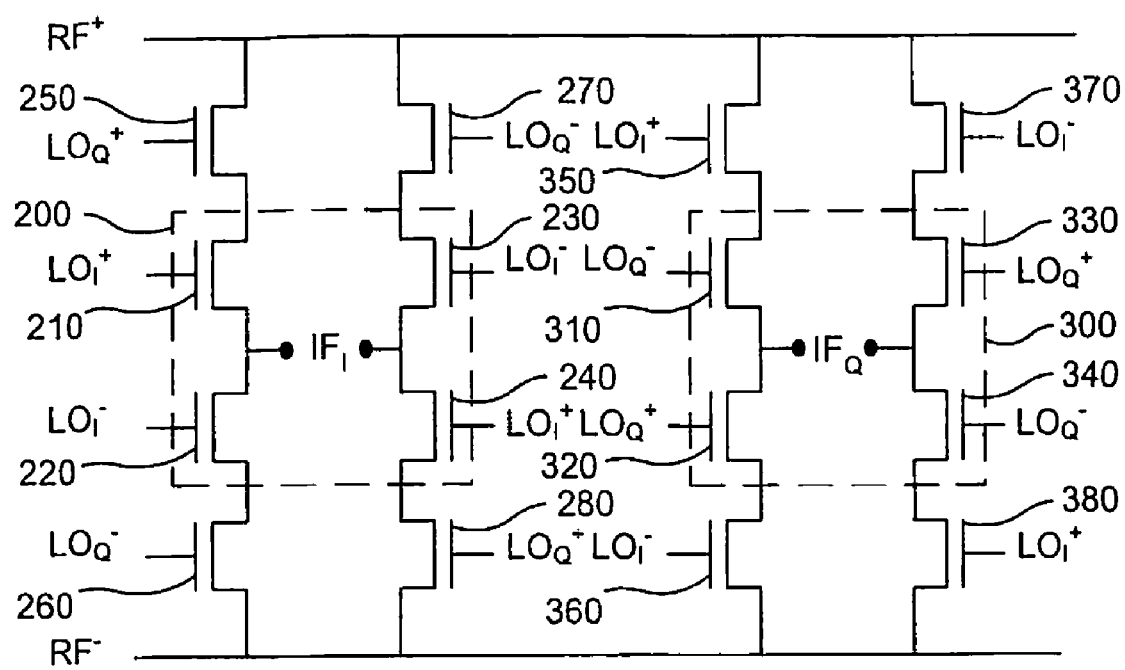
FIG. 3 is a block diagram of a the mixer arrangement according to the invention.

FIG. 3 illustrates a mixer arrangement according to the invention. The mixer arrangement is arranged to generate intermediate frequency signals $IF_I$ and $IF_Q$ having I and Q phases, respectively, based on an RF signal provided at $RF^-$ and $RF^+$ terminals, or vice versa. The arrangement is a balanced passive quadrature mixer arrangement comprising a first and a second mixer 200, 300 connected in parallel and arranged to be driven in quadrature. Each of the mixers 200, 300 comprises a set of mixing devices 210, 220, 230, 240, and 310, 320, 330, 340. Here the number of mixing devices of each mixer 200, 300 is four. However, the number is only exemplary and should not be taken as limiting the scope of the claims. The mixing means 210-240, 310-340 may comprise a FET transistor, such as a MOSFET, which may be provided using CMOS technology. Each of the mixing means 210-240, 310-340 provides a voltage switch for enabling mixing of the RF signal and first and second LO signals, or mixing of the IF signal and the LO signals. The MOS transistor has true voltage switch characteristics. Therefore, it is possible to provide switching in the voltage domain. This makes it possible to reduce or even eliminate the DC current flow through the transistor, and thereby avoid the 1/f noise, which would be a problem especially for direct conversion and low IF-receiver characteristics.

Each mixing means 210-240, 310-340 may be provided as an NMOS transistor or a PMOS transistor. The NMOS transistor has better switch performance than the PMOS transistor due to the better mobility of electrons than holes. Other voltage controlled switches, such as the junction field effect transistor (JFET) may still alternatively be utilized as the mixing means.

The topology of the first and second mixers 200, 300 is basically the same. Thus, a first terminal of the first mixing means 210, 310 is operatively connected to a positive RF terminal, which may be connected to any of the antennas 10, 11. A second terminal of the first mixing means 210, 310 is connected to a first terminal of the second mixing means 220, 320. A second terminal of the second mixing means 220, 320 is operatively connected to a negative RF terminal. A first terminal of the third mixing means 230, 330 is operatively connected to the positive RF terminal. A second terminal of the third mixing means 230, 330 is connected to a first terminal of the fourth mixing means 240, 340. A second terminal of the fourth mixing means 240, 340 is operatively connected to the negative RF terminal. Also, a connection is provided between the second terminals of the first and third mixing means 210, 230, 310, 330, and thus between the first terminals of the second and fourth mixing means 220, 240, 320, 340. At said connection, IF terminals are provided for providing, or receiving, first and second IF signals $IF_I$ and $IF_Q$, as will be explained below.

Each of the mixing means 210-240, 310-340 comprises a third terminal for receiving a signal from a local oscillator (not shown). During operation of the mixing arrangement, the RF signal will be mixed with mixing signals, i.e. the LO signal to provide a down converted IF signal. In use in a transmitter arrangement, the IF signal will be mixed with the LO signal to provide an up converted RF signal. The mixer arrangement is driven in quadrature. Thus, the first and fourth mixing means 210, 240 of the first mixer 200 will in operation receive a first LO signal $LO_I^+$ having a first phase θ and frequency at their third terminals. The second and third mixing means 220, 230 of the first mixer 200 will in operation receive the inverse of the first LO signal $LO_I^-$, i.e. a LO signal phase shifted by π radians. The second and third mixing means 320, 330 of the second mixer 300 will in operation receive a second LO signal $LO_Q^+$ having a second phase θ+π/2 and a frequency corresponding to the first LO signal at their third terminals. The first and fourth mixing means 310, 340 of the second mixer 300 will in operation receive the inverse of the second LO signal $LO_Q^-$, i.e. a LO signal phase shifted π radians in relation to the second LO signal.

To avoid short circuit paths between the IF terminals, signal path switches are provided between the mixers and the RF terminals. Thus, the first mixer 200 comprises a first set of signal path switches 250, 260, 270, 280, and the second mixer 300 comprises a second set of signal path switches 350, 360, 370, 380. In this embodiment, the signal path switches are provided by mixing means corresponding to the mixing means 210-240, 310-340 of the mixers 200, 300. The first and fourth signal path switches 250, 280 of the first mixer 200 correspond to the second and third mixing means 320, 330 of the second mixer 300. The second and third signal path switches 260, 270 of the first mixer 200 correspond to the first and fourth mixing means 310, 340 of the second mixer 300. The first and fourth signal path switches 350, 380 of the second mixer 300 correspond to the first and fourth mixing means 210, 240 of the first mixer 200. The second and third signal path switches 360, 370 of the second mixer 300 correspond to the second and third mixing means 220, 230 of the second mixer 300.

A first terminal of the first and third signal path switches 250, 270, 350, 370 is connected to the positive RF terminal, and a second terminal of said switches are connected to the first terminal of the first and third mixing means 210, 230, 310, 330, respectively. Correspondingly, a first terminal of the second and fourth signal path switches 260, 280, 360, 380 is connected to the second terminal of the second and forth mixing means 220, 240, 320, 320, and a second terminal of said switches is connected to the negative RF terminal, respectively.

Third terminal of the switches 250-280, 350-380 are connected to receive LO signals correspondingly to their corresponding mixing means 210-240, 310-340 of the mixers 200, 300. Thus, in this embodiment the switches will be a part of the frequency translation from a first to a second frequency.

The mixer arrangement is arranged to achieve quadrature mixing. Thus, two switches driven by the second LO signal $LO_Q$ are for some time intervals conducting simultaneously as two mixing means driven by the first LO signal $LO_I$ are conducting.

Figure 1:
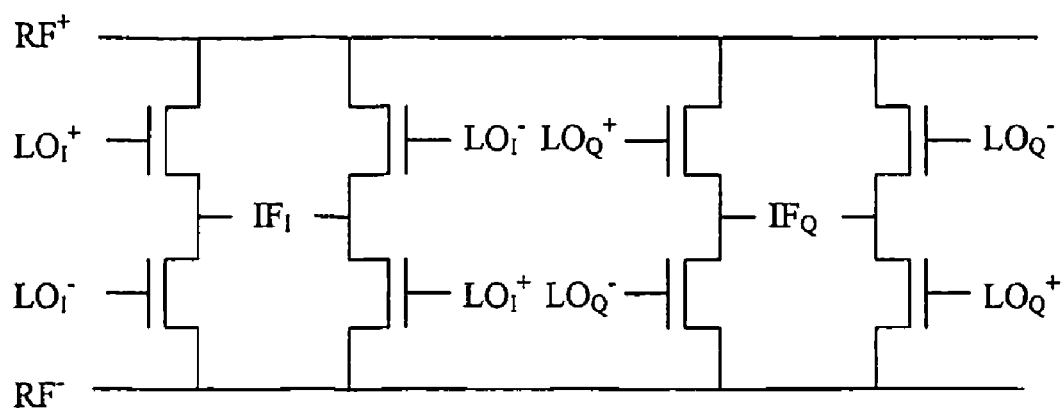
FIG. 1 is a block diagram of a prior art mixer arrangement.
Figure 4:
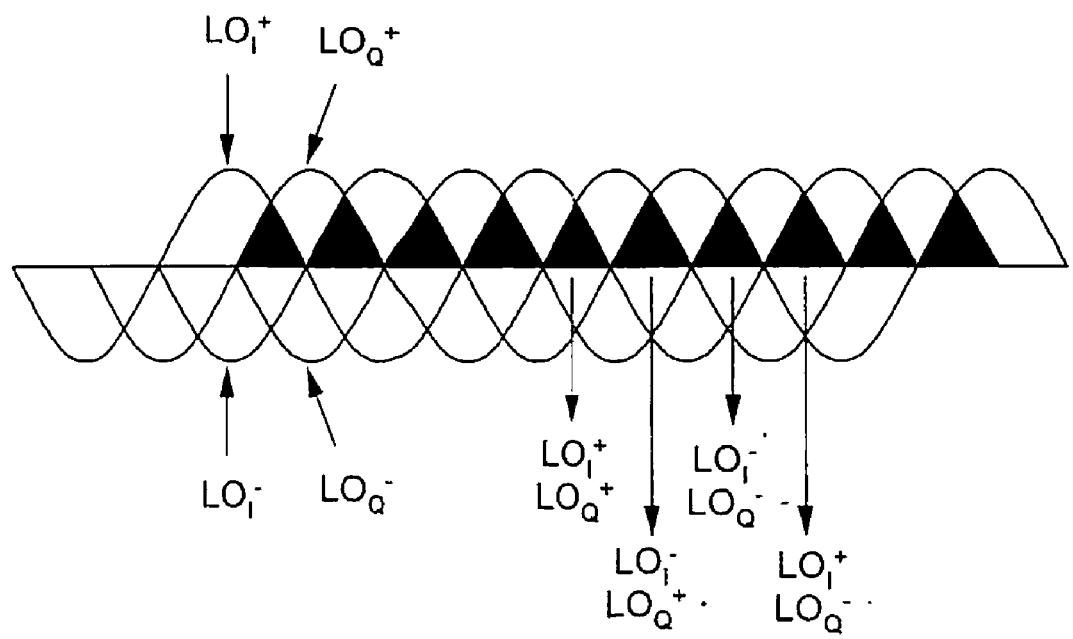
FIG. 4 is a signaling scheme illustrating the local oscillator signals for controlling the mixer arrangement.

FIG. 4 illustrates the local oscillator (LO) signals $LO_I^+$, $LO_I^-$, $LO_Q^+$, and $LO_Q^-$. $LO_I$ and $LO_Q$ can each have a first and a second state, i.e. a specific frequency and phase, for turning a mixing means connected to the signal on or off. The first mixer 200 is conductive for a first and/or a second state of the first LO signal $LO_I$. The second mixer 300 is conductive for a first and/or a second state of the second mixing signal. As can be seen from the scheme of FIG. 4, two LO signals can be positive simultaneously, which corresponds to the gray areas. If the phases of the LO signals are chosen as described above, $LO_I^+$ and $LO_Q^-$, $LO_I^+$ and $LO_Q^+$, $LO_Q^+$ and $LO_I^-$, and $LO_I^-$ and $LO_Q^-$, respectively, will be positive simultaneously, as is illustrated in FIG. 4. To avoid short circuits, the switches are therefore arranged such that in each potential path between the IF terminals $IF_I$ and $IF_Q$ there are at least two switches controlled by signals having opposite phases, such as $LO_I^+$ and $LO_I^-$, wherein there will be no risk of interference between the IF terminals. The switches 250-280 connected to the first mixer 200 are arranged to be conductive for the first and/or second state of the LO or mixing signal driving the second mixer 300. The switches 350-380 connected to the second mixer 300 are arranged to be conductive for the first and/or second state of the LO or mixing signal driving the first mixer 200. Thus, any short circuit between the mixers 200, 300 is avoided without substantially introducing any noise.

The embodiment of FIG. 3 illustrates one possible combination of providing the mixing means and the switches. There are a number of combinations, which will achieve the same result. Each of the switches may e.g. be interchanged with the mixing means to which it is connected. The combination that achieves the best performance has to be tested in each specific case and should not be limited by the embodiment shown.

The mixer arrangement may be arranged to down convert an RF signal received as an input signal at the RF terminals to an IF output signal provided at the IF terminals. Alternatively, an IF signal provided as an input signal at the IF terminals may be up converted to an RF output signal provided at the RF terminals. Thus, the present invention may be incorporated in either a receiver or a transmitter for providing frequency conversion from a first to a second frequency.

The present invention has been described above with reference to specific embodiments. However, other embodiments than the above described are equally possible within the scope of the invention. Different method steps than those described above, performing the method by hardware or software, may be provided within the scope of the invention. The different features and steps of the invention may be combined in other combinations than those described. The invention is only limited by the appended patent claims.

The invention claimed is:

1. A quadrature mixer arrangement for converting a first signal at a first frequency to a second signal at a second frequency, the arrangement having a first mixer operatively coupled to a first and a second terminal, wherein the first terminal is a positive radio-frequency terminal and the second terminal is a negative radio-frequency terminal; and a second mixer coupled in parallel with the first mixer and operatively coupled to the first and second terminal, wherein the first mixer is arranged to be conductive for a first and/or a second state of a first mixing signal, and arranged to mix the first signal with the first mixing signal to provide the second signal; and the second mixer is arranged to be conductive for a first and/or a second state of a second mixing signal, and arranged to mix the first signal with the second mixing signal to provide the second signal, the arrangement comprising:

a set of switch devices provided in a signal path between the mixers and the first and second terminals, wherein
switch devices coupled to the first mixer are arranged to be conductive for the first and/or second state of the second mixing signal,
switch devices coupled to the second mixer are arranged to be conductive for the first and/or the second state of the first mixing signal, and
the first mixing signal is out of phase with the second mixing signal.

2. The arrangement according to claim 1, wherein the first and second mixing signals are first and second local oscillator (LO) signals ($LO_I$, $LO_Q$) and/or their inverse signals, having a common frequency and first and second phases, which are phase shifted pi/2 radians in relation to each other.

3. The arrangement according to claim 1, wherein the first and second mixer comprise a set of mixing means, each of the mixing means having a first, second, and third terminal, the first mixer adapted to be driven by the first mixing signal being an LO signal and/or its inverse signal having first and third phases received at the third terminals of the mixing means of the first mixer, and the second mixer adapted to be driven by the second mixing signal being a second LO signal and/or its inverse signal having second and fourth phases received at the third terminals of the mixing means of the second mixer.

4. The arrangement according to claim 3, wherein in each of the mixers' first terminals of a first and a third mixing means of the set of mixing means are operatively coupled to the first terminal of the arrangement and second terminals of the first and third mixing means are coupled to first terminals of a second and a fourth mixing means of the set of mixing means, second terminals of the second and fourth mixing means are operatively coupled to the second terminal of the arrangement, and wherein IF terminals are provided at the second terminals of the first and third mixing means.

5. The arrangement according to claim 4, wherein the mixing means are provided by transistors, and wherein the first and fourth mixing means of the first mixer are adapted to be driven by the first mixing signal, the second and third mixing means of the first mixer are adapted to be driven by the inverse signal of the first mixing signal, and wherein the first and fourth mixing means of the second mixer are adapted to be driven by the inverse of the second mixing signal, the second and third mixing means of the second mixer are adapted to be driven by the second mixing signal.

6. The arrangement according to claim 5, wherein in each mixer first and third switch devices are provided in the signal path between the first terminal of the first and third mixing means and the first terminal of the arrangement, and second and fourth switch devices are provided between the second terminals of the second and fourth mixing means and the second terminal of the arrangement.

7. The arrangement according to claim 6, wherein the first and fourth switch devices coupled to the first mixer are adapted to be driven by the second mixing signal, the second and third switch devices coupled to the first mixer are adapted to be driven by the inverse signal of the second mixing signal, the first and fourth switch devices coupled to the second mixer are adapted to be driven by the first mixing signal, and the second and third switch devices coupled to the second mixer are adapted to be driven by the inverse signal of the first mixing signal.

8. The arrangement according to claim 1, wherein the set of switch devices is provided by transistors.

9. The arrangement according to claim 1, wherein the mixers and/or the set of switch devices comprise a voltage controlled switch.

10. The arrangement according to claim 1, wherein the mixers and/or the set of switch devices comprise FET transistors.

11. The arrangement according to claim 10, wherein the FET transistors are provided in CMOS technology.

12. The arrangement according to claim 1, wherein the arrangement is provided as a transmitter mixer, the first signal is a quadrature IF signal to be received as an input signal, and the second signal is an RF signal to be provided as an output signal.

13. The arrangement according to claim 1, wherein the arrangement is provided as a receiver mixer, the first signal is an RF signal to be received as an input signal, and the second signal is a quadrature IF signal to be provided as an output signal.

14. The arrangement according to claim 1, implemented in a wireless communication device having a communication interface for wirelessly communicating with a remote communication device.

15. The arrangement of claim 14, wherein the device is one selected from the group consisting of a portable radio communication equipment, a mobile radio terminal, a pager, a communicator, an electronic organizer, and a smartphone.

16. The arrangement according to claim 14, wherein the device is a mobile telephone.

17. A method of mixing signals for converting a first signal at a first frequency to a second signal at a second frequency having the steps of receiving the first signal; mixing the first signal in a mixer arrangement comprising a first and a second mixer coupled in parallel to provide the second signal, each mixer being coupled to a first and a second terminal, wherein the first terminal is a positive radio-frequency terminal and the second terminal is a negative radio-frequency terminal, by controlling the first mixer to be conductive for a first and/or a second state of a first mixing signal for mixing the first signal with the first mixing signal to provide the second signal; and controlling the second mixer to be conductive for a first and/or a second state of a second mixing signal for mixing the first signal with the second mixing signal to provide the second signal, comprising the step of:

controlling a set of switch devices provided in a signal path between the mixers and the first and second terminals to operatively couple either the first or the second mixer to the first and second terminals by controlling switch devices coupled to the first mixer to be conductive for the first and/or the second state of the second mixing signal; and controlling switch devices coupled to the second mixer to be conductive for the first and/or the second state of the first mixing signal, wherein the first mixing signal is out of phase with the second mixing signal.

18. The method according to claim 17, wherein the first and second mixing signals are first and second local oscillator (LO) signals, and/or their inverse signals, having a common frequency and first and second phases, which are phase shifted pi/2 radians in relation to each other.

19. The method according to claim 17, comprising the steps of providing a set of mixing means in each of the first and second mixer, wherein each of the mixing means has a first, second, and third terminal, driving the first mixer by using the first mixing signal being a first LO signal and/or its inverse signal having first and third phases received at the third terminals of the mixing means of the first mixer, and driving the second mixer by using the second mixing signal being an LO signal and/or its inverse signal having second and fourth phases received at the third terminals of the mixing means of the second mixer.

20. The method according to claim 19, further comprising the steps of for each of the mixers operatively coupling a first terminal of a first and a third mixing means of the set of mixing means to the first terminal of the arrangement and a second terminal of the first and third mixing means to first terminals of a second and a fourth mixing means of the set of mixing means, operatively coupling a second terminal of the second and fourth mixing means to the second terminal of the arrangement, and providing IF terminals at the second terminals of the first and third mixing means.

21. The method according to claim 20, further comprising the steps of providing the mixing means as transistors, driving the first and fourth mixing means of the first mixer by using the first mixing signal, driving the second and third mixing means of the first mixer by using the inverse signal of the first mixing signal, driving the first and fourth mixing means of the second mixer by using the inverse of the second mixing signal, and driving the second and third mixing means of the second mixer by using the second mixing signal.

22. The method according to claim 21, comprising the steps of for each mixer providing the first and third switch devices in the signal path between the first terminal of the first and third mixing means and the first terminal of the mixer arrangement, and second and forth switch devices between the second terminals of the second and fourth mixing means and the second terminal of the mixer arrangement.

23. The method according to claim 22, comprising the steps of driving the first and fourth switch devices coupled to the first mixer by using the second mixing signal, driving the second and third switch devices coupled to the first mixer by using the inverse signal of the second mixing signal, driving the first and fourth switch devices coupled to the second mixer by using the first mixing signal, and driving the second and third switch devices coupled to the second mixer by using the inverse signal of the first mixing signal.

24. The method according to claim 17, comprising the step of providing the switch devices by means of a transistor.

25. The method according to claim 17, comprising the step of providing the mixers and/or the switch devices as a voltage controlled switch.

26. The method according to claim 17, comprising the step of providing the mixers and/or the switch devices by FET transistors.

27. The method according to claim 26, comprising the step of providing the FET transistors by using CMOS technology.

28. The method according to claim 17, comprising the step of providing the arrangement as a transmitter mixer, the first signal being a quadrature IF signal, and the second signal being an RF signal.

29. The method according to claim 17, comprising the step of providing the arrangement as a receiver mixer, the first signal being an RF signal, and the second signal being a quadrature IF signal.

\* \* \* \* \*

UNITED STATES PATENT AND TRADEMARK OFFICE
CERTIFICATE OF CORRECTION

PATENT NO. : 8,060,048 B2  
APPLICATION NO. : 10/596691  
DATED : November 15, 2011  
INVENTOR(S) : Sjöland et al.

Page 1 of 1

It is certified that error appears in the above-identified patent and that said Letters Patent is hereby corrected as shown below:

On the Face Page, in Field (73), under "Assignee", in Column 1, Line 1, delete "Telefonaktibolaget" and insert -- Telefonaktiebolaget --, therefor.

In Column 1, Line 7, delete "IVNENTION" and insert -- INVENTION --, therefor.

In Column 6, Line 19, delete "320, and" and insert -- 340, and --, therefor.

Signed and Sealed this  
Fourteenth Day of February, 2012

David J. Kappos  
*Director of the United States Patent and Trademark Office*